HIGH FREQUENCY TRANSISTOR AND PROCESS FOR FABRICATING SAME
Original Filed Dec. 29, 1964
3 Sheets-Sheet 1
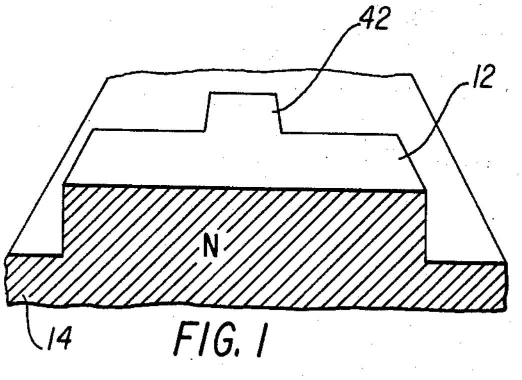
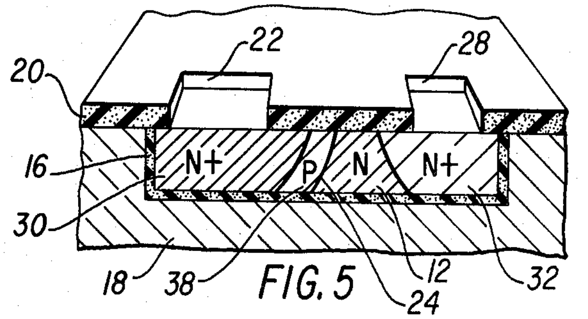
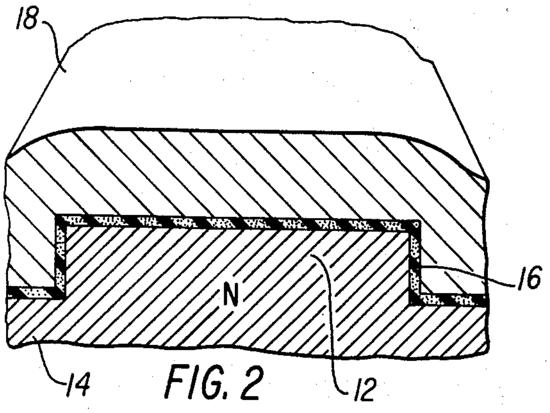
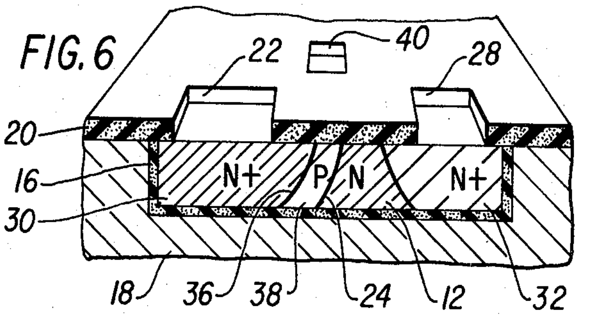
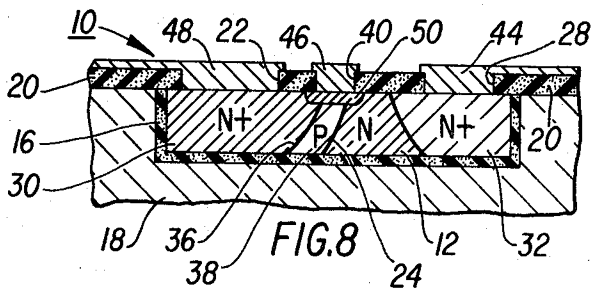
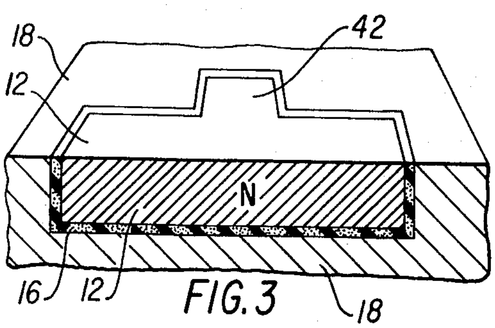
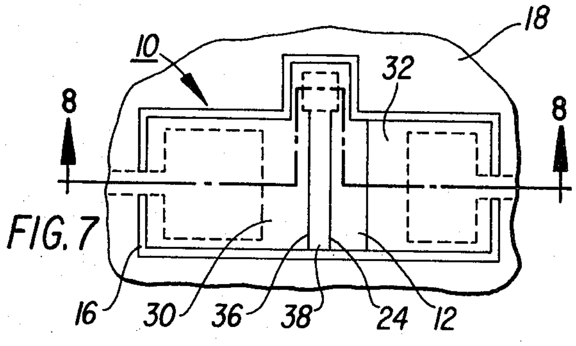
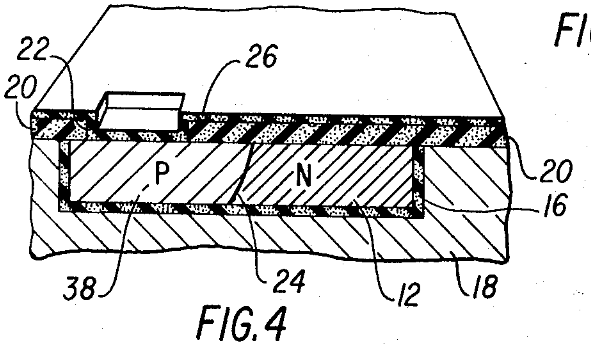
INVENTOR
JACK S. KILBY
BY Melvin Sharp
ATTORNEY Aug. 10, 1971 J. S. KILBY 3,598,664

HIGH FREQUENCY TRANSISTOR AND PROCESS FOR FABRICATING SAME

Original Filed Dec. 29, 1964 3 Sheets-Sheet 2

Aug. 10, 1971 J. S. KILBY 3,598,664

HIGH FREQUENCY TRANSISTOR AND PROCESS FOR FABRICATING SAME

Original Filed Dec. 29, 1964 3 Sheets-Sheet 3

United States Patent Office 3,598,664
Patented Aug. 10, 1971

3,598,664
HIGH FREQUENCY TRANSISTOR AND PROCESS FOR FABRICATING SAME

Jack S. Kilby, Dallas, Tex., assignor to Texas Instruments Incorporated, Dallas, Tex.
Original application Dec. 29, 1964, Ser. No. 421,880, now Patent No. 3,411,051, dated Nov. 12, 1968. Divided and this application Dec. 6, 1967, Ser. No. 705,254
Int. Cl. H01l 7/36, 5/00, 13/00
U.S. Cl. 148—175 7 Claims

ABSTRACT OF THE DISCLOSURE

An integrated circuit is provided wherein a transistor structure is comprised of a single crystal of semiconductor material embedded in a substrate and having an exposed surface substantially coplanar with a substrate surface. The crystal is electrically isolated from the substrate by a layer of insulating oxide disposed between the crystal and the substrate. The crystal is divided into a collector region, a base region and an emitter region which are disposed generally in edge-to-edge relationship. An insulating film is disposed over the surface of the substrate and the surface of the crystal, and metallic terminals extend through apertures in the insulating film into contact with each of the active regions.

This application is a division of application Ser. No. 421,880, now U.S. Pat. 3,411,051.

The present invention relates to semiconductor devices, and more particularly to an improved high frequency transistor and to a process for fabricating the transistor.

In general, the speed at which a transistor can be switched, and therefore the frequency at which the transistor can be operated, is determined by the emitter-base and base-collector capacitance values. Since these capacitances are primarily determined by the size of the junction areas, the overall size of transistor tends to be directly related to the frequency at which the transistor can be operated. However, as the transistor is made smaller, the problems of making electrical contact with the regions of the transistor are increased.

In general, planar type transistors have certain inherent advantages and in general can be fabricated smaller than other types of transistors because they can be handled more easily and the terminals can be made by etching a metallic film deposited on the substrate. Further, the planar transistors can be easily incorporated in integrated circuits formed in a common semiconductor substrate. In the conventional planar transistor construction, the initial lightly doped substrate material usually forms the collector. Impurities of the opposite type are then diffused into the substrate in moderate concentration to form a base region, and finally a higher concentration of the first type of impurities are diffused into the base region to form the emitter region. In this type of construction, the collector region completely surrounds the base region and the base region completely surrounds the emitter region. Therefore the area of the base-collector junction is equal to the entire submerged surface area of the base region which must be at least equal to the area required for the terminal contact with the base plus the area required for the emitter region, plus the circumference of the base-collector junction multiplied by the diffusion depth. Similarly, the area of the base-emitter junction must be at least equal to the required emitter terminal area plus the circumference of the base-emitter junction multiplied by the diffusion depth. A disadvantage of this type of construction is that the current flows generally perpendicular to the surface of the substrate and the collector resistance is relatively high because of the long average current path between the collector terminal at the surface of the substrate and the major portion of the collector-base junction which is at the bottom of the base diffusion.

The present invention contemplates an improved transistor construction wherein the area of the collector-base and the area of the base-emitter junctions can be maintained at a minimum so as to increase the frequency at which the transistor can be operated.

Another object of the invention is to provide a transsistor construction wherein the current flow is primarily parallel to the surface of the semiconductor crystal so that the collector resistance can be maintained at a minimum.

Another object of the invention is to provide a transistor which can be manufactured by a relatively inexpensive process and yet obtain high frequency preformance.

A further object of the invention is to provide a surface oriented transistor which is particularly adapted for use in an integrated circuit by reason of the fact that it is isolated from a substrate by a submerged insulation layer.

Still another object of the invention is to provide a transistor construction having a plurality of separate emitters with minimum emitter-base junction areas and a common base and common collector.

A further object of the invention is to provide a transistor construction having a plurality of separate bases and separate emitters and a common collector.

Yet another object of the invention is to provide a process for fabricating transistors having the above mentioned advantages.

The foregoing objects and advantages are accomplished by a transistor comprising a single crystal of semiconductor material surrounded by an insulating layer and imbedded in and electrically insulated from a substrate. A collector-base junction is formed transversely of the crystal by edge-to-edge regions of different type impurity concentrations so that the area of the junction is approximately equal only to the cross-sectional area of the crystal. A base-emitter junction is also formed transversely of the crystal by edge-to-edge regions of different type impurity concentrations and is also approximately equal only to the cross-sectional area of the crystal. In one embodiment, the base-emitter junction is spaced equidistantly from the base-collector junction at all points.

In accordance with a more specific aspect of the invention, the transistor is comprised of a single crystal of semiconductor material which is imbedded in a substrate and has an exposed surface coplanar with a surface of the substrate. The crystal is electrically isolated from the substrate by a layer of insulating oxide disposed between the crystal and the substrate. The crystal is divided into a collector region, a base region and an emitter region which are disposed generally in edge-to-edge relationship. An insulating film is disposed over the surface of the substrate and the surface of the crystal and metallic terminals extend through apertures in the insulating film into contact with each of the active regions.

In accordance with another aspect of the invention, a transistor device having a plurality of emitters, a plurality of bases, a plurality of collectors, or substantially any combination thereof is also provided.

In accordance with a more specific aspect of the invention, a multiple emitter transistor is comprised of a single crystal of semiconductor material imbedded in and insulated from a substrate, and having a surface generally coplanar with a surface of the substrate. The crystal has a central collector region extending from the surface of the crystal to the underlying insulating layer. A base region extends around at least a portion of the edge of collector region and also extends from the surface to the underlying insulating layer. A number of emitter regions are electrically isolated from each other by the insulating layer, are in contact with the base region, and also extend from the surface of the crystal down to the insulating layer underlying the crystal.

In accordance with still another specific aspect of the invention, a transistor having a common collector and a plurality of bases and a plurality of emitters is also provided. This transistor construction is comprised of a single crystal having an underlying collector region with the bottom surface coplanar with one surface of a substrate, a plurality of means standing up from and electrically isolated one from the other except through the common collector region by an insulation sleeve around each mesa, the upper end of each mesa being generally coplanar with the other surface of the substrate, a base region extending transversely across the lower end of each mesa and forming a collector-base junction extending transversely of the mesa, an emitter region formed in the upper end of each mesa, both the base region and the emitter region emerging at the surface of the mesa for electrical contact with the respective regions.

This invention is also concerned with a process for manufacturing the transistors of the present invention which broadly comprises insulating an elongated semiconductor crystal by surrounding the crystal with insulation, then diffusing impurities through an opening in the insulation until the impurities permeate a portion of the crystal to the boundary formed by the bottom and sides of the insulating layer adjacent the opening so that the junction formed at the diffusion front extends only across one cross section of the crystal. More specifically, the process comprises etching a mesa on the surface of a single crystal semiconductor material, forming an electrical insulating layer over the mesa and the substrate, forming a body of substrate material over the insulation layer and around the mesa, removing the remainder of the semiconductor material from the mesa to form a crystal island of semiconductor material imbedded in and electrically isolated from the substrate and having a surface coplanar with that of the substrate, forming a diffusion mask over the crystal having an opening at one end of the crystal, diffusing a base region forming impurity through the opening in the mask and driving the impurities to the bottom and sides of the crystal adjacent the openings so as to form a collector-base junction extending transversely across the crystal, diffusing an emitter impurity material through the opening in the diffusion mask and driving the impurities to the bottom and sides of the crystal adjacent the openings to form a transverse base-emitter junction substantially equidistant from the base-collector junction at all points.

Additional objects and advantages of the invention will be evident to those skilled in the art from the following detailed description and drawings, wherein:

FIGS. 1–6 are schematic drawings illustrating certain of the steps of the process of the present invention;

FIG. 7 is a somewhat schematic plan view of a transistor constructed in accordance with the present invention;

FIG. 8 is a sectional view taken substantially on lines 8—8 of FIG. 7;

Figures 9, 10, 11, 12:
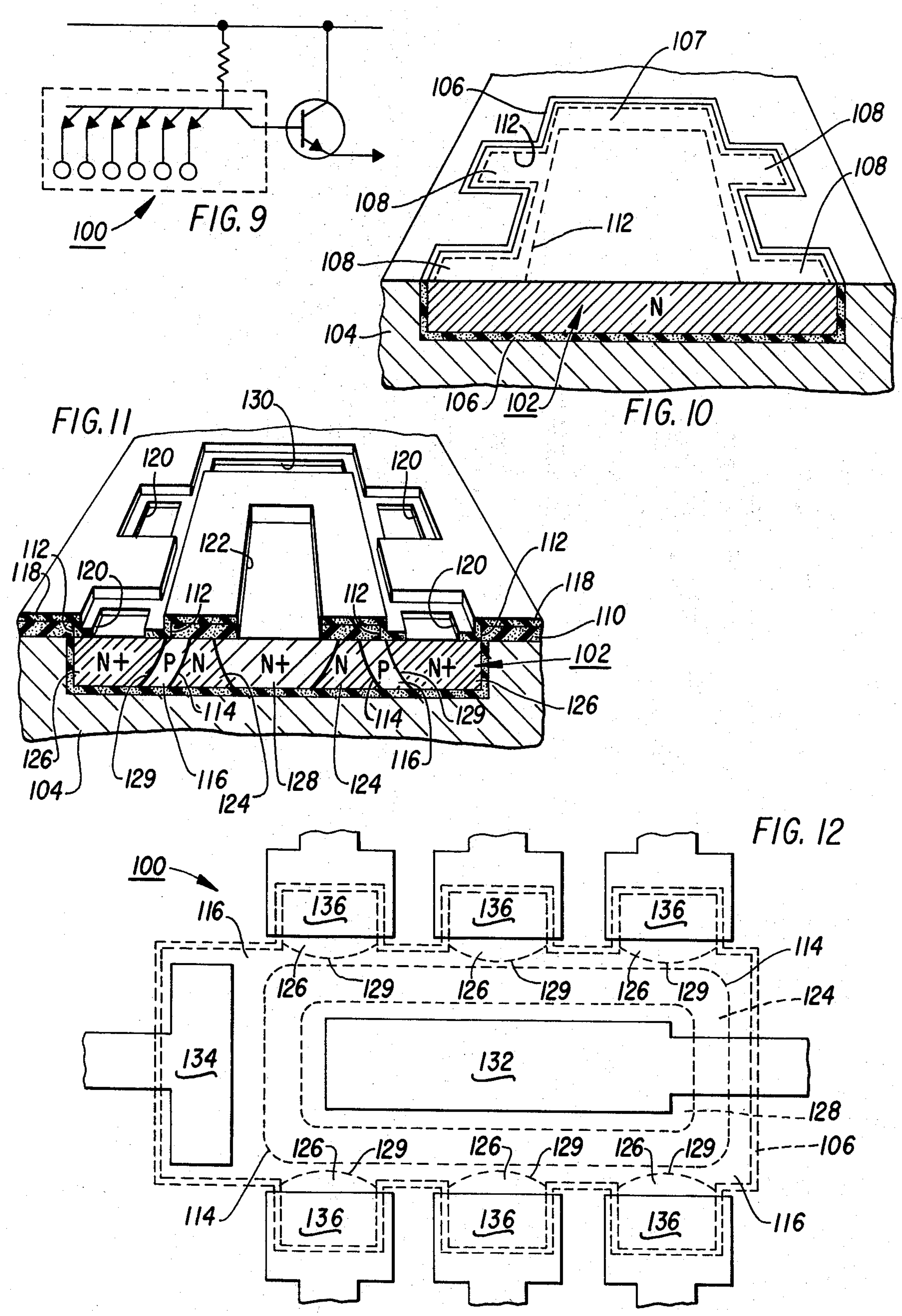
FIG. 9 is a schematic diagram of a conventional logic circuit illustrating a transistor device constructed in accordance with the present invention.
FIGS. 10 and 11 are schematic perspective views illustrating a process for fabricating the transistor device illustrated in FIG. 9.
FIG. 12 is a plan view of the transistor device illustrated in FIG. 9 and constructed in accordance with the present invention.

Referring now to the drawings, a transistor constructed in accordance with the present invention is indicated generally by the reference numeral 10 in FIG. 7. The construction of the transistor 10 can best be understood from a description of the process for fabricating the transistor, which process is illustrated in FIGS. 1–6 and 8.

The transistor 10 is fabricated by first forming a mesa 12 on the surface of a single crystal semiconductor body 14 as shown in FIG. 1. The semiconductor body 14 is lightly doped and suitable for the collector region of the transistor. For example, the body 14 may be silicon lightly doped with N-type impurities. The mesa 12 is formed by protecting that area with a photo-resist material, and then etching the remaining surface of the semiconductor crystal 14 away, Next, an insulating layer 16, such as silicon dioxide, is formed over the mesa 12 and over the remainder of the surface of the substrate 14 on which the mesa is located. Then polycrystalline semiconductor material or other suitable substrate material 18 is deposited, grown or otherwise formed over the insulating layer 16 as shown in FIG. 2. The lower surface of the semiconductor crystal 14 is then lapped away so as to leave only that portion of the semiconductor material which was previously the mesa 12 imbedded in the surface of the substrate material 18 and electrically isolated from the substrate material by the insulating oxide layer 16 as shown in FIG. 3, wherein the structure of FIG. 2 is shown inverted. The body of semiconductor material 12 is generally elongated, the sectional view of FIG. 3 being taken along what will hereafter be considered as the longitudinal axis thereof, and is surrounded on the bottom and sides by the insulating layer 16. The top side is an open surface coplanar with the surface of the substrate 18.

Next, a layer of silicon dioxide 20 or other insulating and diffusing masking material is deposited over the surface of the substrate 18 and crystal 12. An aperture 22 is cut in the oxide layer 20 near one edge of the isolation layer 16 by conventional photo-resist and etching techniques and impurities of a different type and moderate concentration are diffused through the aperture 22 to form a base region 38 as shown in FIG. 4. For example, if the semiconductor material 12 is initially doped with a light concentration of N-type impurities, P-type impurities will then be diffused through the opening 22 to form the base region. Because the diffusion is initiated in opening 22 near one edge of the isolation layer 16 and spreads more or less spherically within the semiconductor crystal 12 base region impurities are driven not only to the very bottom of the pocket formed by the isolation layer 16 but also to all sides of the pocket except the side most remote from the aperture 22 thus forming the P-N junction 24 more or less transversely or perpendicularly with respect to the top and bottom surface of the crystal. The result is that the diffusion edge extending transversely across the semiconductor crystal 12 which forms a junction 24 having an area approximately equal only to the transverse cross-sectional area of the crystal 12.

During the diffusion process, a second relatively thin layer 26 of oxide is formed over the surface of the crystal 12 and over the previous oxide layer 20. Layer 26 is removed by immersing the substrate in a suitable etchant and permitting the substrate to remain there only long enough to remove the oxide layer 26 and reopen the original diffusion aperture 22. It is also desirable to cut a second diffusion aperture 28 in the oxide layer 20 near the edge of isolation layer 16 opposite aperture 22, substantially as illustrated in FIG. 5.

Next, N-type impurities of a greater concentration than the collector region 12 are diffused through both the apertures 22 and 28 and driven to the bottom and sides of the crystal adjacent the apertures 22 and 28 to form heavily doped N+-type regions 30 and 32 as shown in FIG. 5, but the diffusion is not permitted to permeate to the previously formed base-collector junction 24. The heavily doped region 32 provides a good electrical contact with the lightly doped N-type collector region 12 to reduce the collector resistance of the transistor. The heavily doped N+-type region 30 forms the emitter region of the transistor and a base-emitter junction 36 with the base region 38, as shown in FIG. 6. It is important to note that the base-emitter junction 36 is generally parallel to the base-collector junction 24 and also extends transversely of the crystal 12 as a result of driving the impurities completely to the bottom and sides of the crystal 12 adjacent the aperture 22 during the diffusion process. However, the N-type diffusion is carried out for a shorter period of time than the P-type base diffusion so as to maintain the desired spacing between the junctions 24 and 36. It will also be noted that the diffusion of the N+-type region 30 is made through the same aperture 22 as the diffusion of the P-type base region 38 so that any irregularities in the form of the collector-base junction 24 as a result of irregularities in the diffusion aperture 22 will tend to be reproduced in the base-emitter junction 36.

Next, any light oxide film grown over the substrate during the N-type diffusion is removed by a suitable etch to open the apertures 22 and 28 and clean the surface of the crystal exposed thereby. A third aperture 40 as shown in FIG. 6 is formed over the extended portion 42 of the mesa as illustrated in FIG. 1. A metallic film is then deposited over the substrate and selectively removed by photo-resist and etching techniques to form terminal contacts 44, 46 and 48 for the collector, base and emitter, respectively, the respective electrical contacts passing through the apertures 28, 40 and 42, respectively as shown in FIG. 8. The base contact area between the terminal contact 46 and the base region 38 may extend to a greater extent across the base region if desired, and is preferably alloyed into the base region to form a heavily doped P+-type zone 50 to insure good electrical contact with the base region. The terminal contacts or conductors 44 and 48 may also be alloyed into the regions 32 and 30, respectively, to provide good electrical contact, although the high conductivity of the heavily doped regions 30 and 32 reduces the requirement for this.

Thus, the transistor device 10 is comprised of a single crystal 12 of semiconductor material which is imbedded in and electrically isolated from a substrate 18. The crystal is divided longitudinally into collector, base and emitter regions 12, 38 and 30, respectively, to form generally parallel collector-base and base-emitter junctions 24 and 36 which extend generally parallel transversely of the crystal as shown in FIGS. 7 and 8. Therefore the junctions 24 and 36 each have an area approximately equal only to the cross-sectional area of the crystal, yet these active regions, collector, base and emitter, are so disposed and are of such a size that electrical contact can easily be made with each region. The current flow is generally parallel to the surface of the substrate, rather than normal to the surface as in other surface-oriented transistors. The nearness of the collector-base junction 24 to the collector conductor 44 reduces the resistance of the collector. Further, since each junction area is restricted to a plane surface substantially perpendicular to at least that surface of the crystal which is coplanar with the surface of the substrate, a substantial reduction in junction area is effected for a given size transistor.

Another embodiment of the present invention is illustrated in FIG. 12 and is designated by the reference numeral 100. The transistor 100 has a plurality of emitters and is particularly suited for use in a conventional $T^2L$ logic circuit such as illustrated schematically in FIG. 9. The construction of the transistor 100 can also best be understood by a description of the process for fabricating the transistor, the process being illustrated in FIGS. 10 and 11.

As illustrated in FIG. 10, a single crystal 102 of semiconductor material is imbedded in and electrically isolated from a substrate 104 by a layer 106 of insulating material such as silicon dioxide. The structure illustrated in FIG. 10 may be fabricated using the process described in connection with the transistor device 10 as illustrated in FIGS. 1–3. The crystal 102 has anelongated body portion 107 with a plurality (six in the device 100) of peninsula portions 108 extending from the opposite sides of the body portion 107 at spaced points so that each peninsula 108 is isolated from the other peninsulas by the insulating layer 106, except through the body portion 107. The single crystal 102 may initially be suitably doped to form a collector region, and more specifically may be silicon lightly doped with N-type impurities.

Next, an oxide masking and insulating film 110 is formed over the surface of the substrate 104 and the crystal 102 and a ring-shaped diffusion sperture 112 as shown in FIG. 11 is then formed in the oxide layer 110 generally in the area indicated in dotted outline in FIG. 10. A P-type diffusion is then made through the aperture 112 and the diffusion carried out until the P-type impurities are driven to the bottom of the crystal 102 and permeate a portion of the crystal to the bottom of the insulating layer 106. The P-type diffusion front forms a collector-base junction 114 which is iluustrated in dotted outline in FIG. 12. It will be noted that the collector-base junction 114 and the base region 116 extend completely around the central portion of the original N-type material of the starting crystal 102.

During the diffusion of the P-type base region 116, a second relatively thin oxide film 118 is grown over the surface of the crystal 102 exposed through the aperture 112 and also over the first oxide layer 110. A set of emitter diffusion apertures 120 is then formed in the second oxide film 118 over the peninsulas 108 using conventional photo-resist and etching techniques. A diffusion aperture 122 is also formed through both the oxide films 118 and 110 to expose the surface of the crystal 102 in the N-type collector region 124. An N-type impurity material is then diffused through the apertures 120 and 122 to form relatively heavily doped emitter regions 126 and a collector contact region 128. The last N-type diffusion is driven from the apertures 120 to the bottom and sides of each peninsula 108 and from the aperture 122 to the bottom of the body portion 107 so that base-emitter junctions 129 are formed which extend transversely across each of the peninsulas and therefore have an area approximately equal to the cross-sectional area of the peninsulas and so that the collector contact region 128 is centrally formed within the collector region 124.

The aperture 120 and 122 are then cleaned of any oxide which may have been formed during the last diffusion step and an aperture 130 is formed over one end of the base region 116. Then a thin metallic film is deposited over the substrate and selectively etched to form a collector terminal 132, a base terminal 134 and emitter terminals 136 as shown in FIG. 12. Thus it will be noted that a transistor device having six separate emitters 126, a common base 116, and a common collector 124 has been described. From a comparison of FIG. 11 and FIG. 8, it will be noted that each of the transistors formed by an emitter 126, a common base 116 and a common collector 124 in the device 100 has substantially the same construction as the transistor 10.

Figures 13, 14, 15, 16, 17, 18, 19, 20:
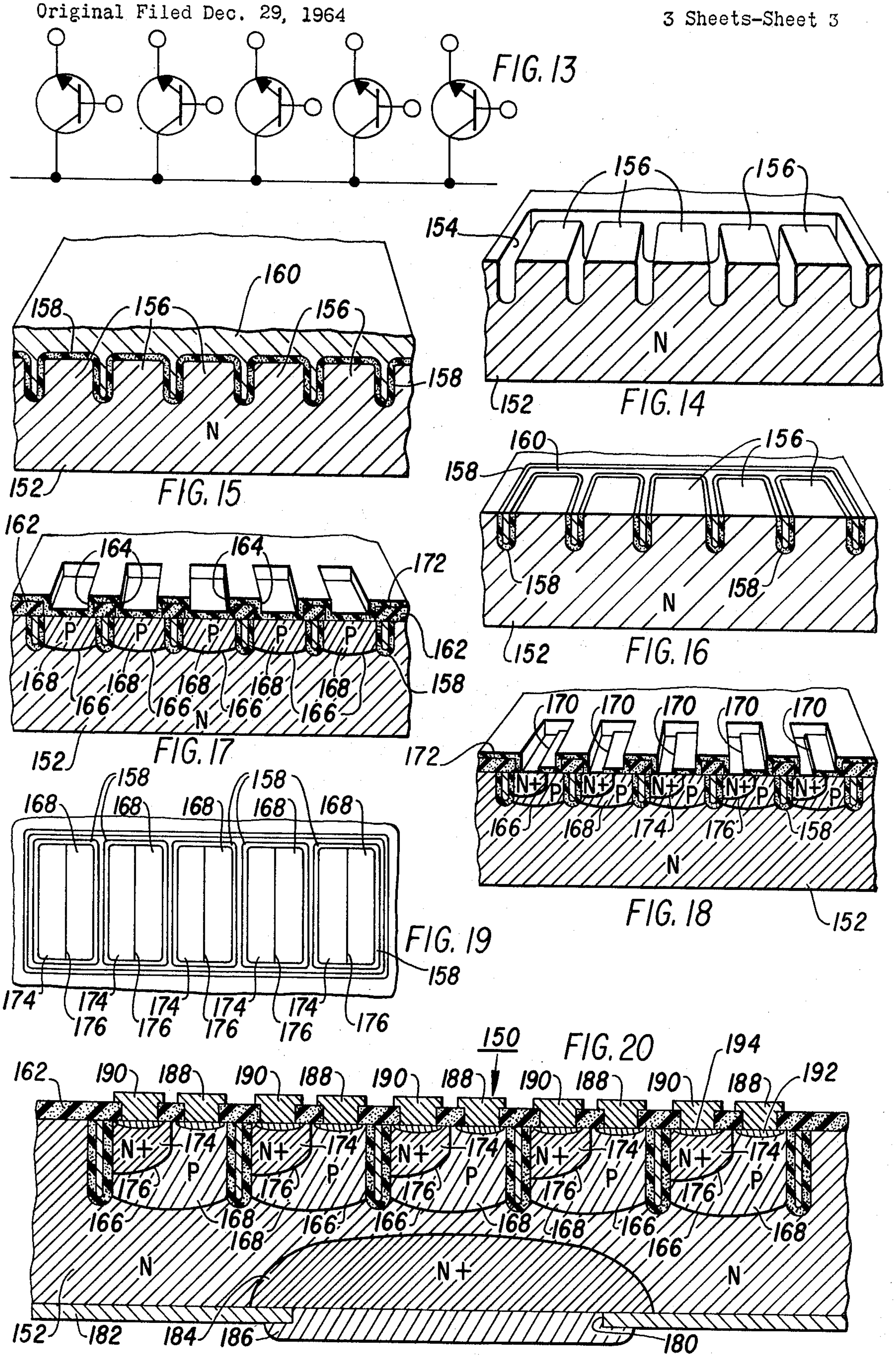
FIG. 13 is a schematic circuit diagram of the device illustrated in FIG. 20.
FIGS. 14–18 are schematic drawings illustrating another process for constructing another transistor device in accordance with the present invention.
FIG. 19 is a plan view of the transistor device costructed in accordance with the present invention with the insulation layers and contacts omitted.
FIG. 20 is a sectional view of the transistor illustrated in schematic circuit diagram form in FIG. 13.

Another transistor device constructed in accordance with the present invention is indicated generally by the reference numeral 150 in FIG. 20. The transistor 150 has an equivalent circuit as illustrated in FIG. 13 and may be more easily understood by a description of the process for fabricating the transistor which is illustrated in FIGS. 14–19 and which will now be described.

In fabricating the transistor 150, a single crystal substrate 152 suitable for forming a collector region, such as silicon lightly doped with N-type impurities, is surface etched to form grooves 154 which are so patterned as to leave a number of mesas 156 as shown in FIG. 14. An insulating layer 158 such as silicon dioxide is then grown over the surface of the substrate 152, and a suitable substrate material 160 such as polycrystalline silicon is deposited over the oxide insulating layer 158 to fill the remaining portion of the grooves 154 as illustrated in FIG. 15.

Next, the surface of the substrate material 160 is lapped to remove the excess material 160 along with the portion of the insulating layer 158 overlying the tops of the mesas 156 as illustrated in FIG. 16, thereby to expose the top surfaces of the N-type substrate material forming the mesas 156. However, it will be noted that each of the mesas 156 is electrically isolated from the others, except through the substrate 152, by a sleeve or collar 158 of the oxide film, which can best be seen in FIG. 19.

Next, an oxide film 162 is formed over the surface of the substrate 152 and a set of diffusion aperture 164 formed over each of the mesas 156 as shown in FIG 17. P-type diffusions are then made through the diffusion apertures 164 until the impurities completely permeate the mesas to the boundaries defined by the insulating collars 158, and thereby form collector-base junctions 166 which extend transversely across each mesa. It will be noted that the base regions 168 thus formed are electrically isolated one from the other by the insulating collars 158. Thus the diffusion of the P-type material extends into all portions of each mesa region 156, but does not exceed the depths of the insulation collars 158 thereby isolating the several mesas so as to maintain electrical isolation of the respective base regions 168.

Next, smaller diffusion apertures 170 are formed in the oxide film 172 which grew over the substrate during the P-type diffusion as shown in FIG. 18. The apertures 170 preferably extend for the length of each mesa 156 as did the diffusion apertures 164. A high concentration of N-type impurities is then diffused through the apertures 170 over approximately half of the area of each of the mesas (as best seen in FIG. 19) to form emitter regions 174 and base-emitter junctions 176.

A diffusion aperture 180 is formed in an oxide film 182 grown on the bottom surface of the N-type substrate 152 and a high concentration $N^+$-type region 184 is formed by diffusing impurities into the low concentration N-type region to make good electrical contact with the collector region as shown in FIG. 20. Apertures are formed in the oxide layer 162 over each of the emitter and base regions and metallic films deposited over both surfaces of the substrate. The metallic films are then selectively etched through a photo-resist mask to form a collector terminal 186, base terminals 188 and emitter terminals 190 as illustrated in FIG. 20. The terminals 188 and 190 may extend over as much of the length of the exposed surfaces of base and emitter regions 168 and 174 as desired, and may be alloyed into the regions to form high concentration regions 192 and 194 for good ohmic contact with the active regions. The equivalent circuit of the transistor device 150 is illustrated in FIG. 13 wherein it will be noted that the collectors of the several transistors are common, but that separate base and emitter terminals are provided, permitting considerable latitude in the use of the device.

From the above detailed description of preferred embodiments of the invention, it will be noted that a novel process for fabricating a transistor has been described. In general, the process consists of diffusing one or more active zones into a single crystal of semiconductor material surrounded by an insulating layer until the only diffusion front or junction extends essentially transversely of the crystal between at least two different boundary sides defined by the insulating layer. Various specific aspects of the process permit the fabrication of multiple emitter transistor devices, and also multiple emitter and multiple base devices, as well as various other configurations. For example, using the basic configuration of the device 100, the active zones may be reversed so as to provide separate base-collector junctions and common emitter and base regions. Further, it will be noted that a number of the transistor devices 10 may be placed in side-by-side relationship and any of the common zones interconnected by linking regions of the crystal as well as by linking metallic contacts. A transistor having minimum collector-base and base-emitter junction areas has been provided which is particularly suited for use at high frequencies because of the low junction capacities. Further, the collector resistance is maintained at a minimum because of the close proximity between the collector-base junction and the collector terminal.

The transistor comprises essentially a bar of single crystal semiconductor material enveloped in one or more insulation layers to isolate one or more of the active regions, the active regions being each disposed in edge-to-edge relation to form junctions extending generally transversely across the semiconductor bar for minimum junction area. This novel construction permits fabrication of multi-emitter and combination multi-emitter and multi-base devices also having small junction areas and suitable for use at high frequencies. Further, the process is a significant simplification of the processes heretofore required in order to obtain transistors useful at corresponding frequencies. Further, both the process and the resulting transistor constructions are particularly suited for use in integrated circuit devices. Although the emitter region of the device 10 is preferably diffused through the same diffusion aperture 22 as the base region 38 as shown in FIG. 6, it will be appreciated that within the broader aspects of the invention the emitter may be diffused through newly formed apertures as in the processes for forming the devices 100 and 150.

Although several embodiments of the invention have been described in detail, it is to be understood that various changes, substitutions and alterations in the transistor device and in the steps of the process may be made without departing from the spirit and scope of the invention as defined by the appended claims.

What is claimed is:

1. The process for fabricating a transistor comprising the steps of:

etching the surface of a single crystal of semiconductor material of one impurity type to form a mesa, forming an insulating layer over the etched surface of the crystal including the top and sides of the mesa, forming a substrate over the insulating layer and around the mesa, lapping the crystal off until only the mesa portion of the crystal remains as an island embedded in and electrically isolated from the substrate by the insulating layer and having one surface substantially coplanar with the surface of the substrate, diffusing impurities of opposite type through the exposed surface of the crystal into a sufficient portion of one end of the crystal to form a base region and a collector-base junction extending transversely across the crystal from the surface to the insulating layer, and diffusing impurities of said one type through the surface of the crystal into the previously diffused base region to form an emitter region and a base-emitter junction extending from the surface substantially transversely through the crystal and terminating at the insulating layer.

2. The process defined in claim 1 wherein:

the impurities diffused to form the base and emitter regions are diffused through the same diffusion aperture in a diffusion mask whereby the collector-base and base-emitter junctions will be spaced substantially equidistant at all points.

3. A process as defined by claim 1 wherein said semiconductor is silicon.

4. The process for fabricating a transistor comprising the steps of:

etching the surface of a single crystal of semiconductor material of one impurity type to form a mesa, forming an insulating layer over the etched surface of the crystal including the top and sides of the mesa, forming a substrate over the insulating layer and around the mesa, lapping the crystal off until only the mesa portion of the crystal remains as an island embedded in and electrically isolated from the substrate by the insulating layer and having one surface substantially coplanar with the surface of the substrate, forming an oxide film over the surface of the substrate and the crystal forming a diffusion opening in the oxide film extending transversely across one end of the crystal, diffusing base-forming impurities of opposite type through the orifice until the impurities permeate the crystal to the insulating layer surrounding the adjacent end, bottom and sides of the crystal, reopening the diffusion opening, and diffusing emitter-forming impurities of said one type through the orifice until the impurities permeate the crystal to the insulating layer surrounding the adjacent end, bottom and sides of the crystal but short of the diffusion front of the base-forming impurities such that the emitter-base junction will be spaced from the base-collector junction.

5. The process defined in claim 4 further characterized by:

forming a second diffusion opening in the oxide film over the other end of the crystal prior to the diffusion of the emitter-forming impurities whereby a more heavily doped contact region will be formed in contact with the original crystal which serves as the collector.

6. The process defined in claim 5 further characterized by:

forming first and second openings in the oxide film over the emitter and collector, respectively, forming a third opening in the oxide film over the first diffusion region adjacent the diffusion front thereof, and forming metallic terminal contacts on the surface of the oxide film which extend through the openings into contact with the emitter, collector and base regions, respectively.

7. The process of claim 2 wherein said semiconductor is silicon.

References Cited

UNITED STATES PATENTS

| | | | |
|---|---|---|---|
| 2,748,041 | 5/1956 | Leverenz | 148—33 |
| 3,211,972 | 10/1965 | Kilby et al. | 317—235 |
| 3,290,753 | 12/1966 | Chang | 148—175X |
| 3,294,600 | 12/1966 | Yokota | 148—177 |
| 3,328,214 | 6/1967 | Hugle | 148—187X |
| 3,348,105 | 10/1967 | Doyle | 317—234 |
| 3,405,329 | 10/1968 | Loro et al. | 317—234 |
| 3,416,042 | 12/1968 | Thomas et al. | 317—234 |

L. DEWAYNE RUTLEDGE, Primary Examiner

W. G. SABA, Assistant Examiner

U.S. Cl. X.R.

29—578, 580; 117—201, 212; 148—1.5, 33, 187; 317—101, 235